US010312193B2

(12) United States Patent
Gu et al.

(10) Patent No.: US 10,312,193 B2
(45) Date of Patent: Jun. 4, 2019

(54) PACKAGE COMPRISING SWITCHES AND FILTERS

(71) Applicant: QUALCOMM Incorporated, San Diego, CA (US)

(72) Inventors: Shiqun Gu, San Diego, CA (US); Chengjie Zuo, San Diego, CA (US); Steve Fanelli, San Diego, CA (US); Husnu Ahmet Masaracioglu, La Jolla, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/235,790

(22) Filed: Aug. 12, 2016

(65) Prior Publication Data

US 2018/0047673 A1 Feb. 15, 2018

(51) Int. Cl.
*H01L 23/48* (2006.01)
*H01L 23/52* (2006.01)
(Continued)

(52) U.S. Cl.
CPC ........ *H01L 23/5386* (2013.01); *H01L 21/486* (2013.01); *H01L 21/4857* (2013.01); *H01L 21/56* (2013.01); *H01L 21/768* (2013.01); *H01L 23/3107* (2013.01); *H01L 23/3135* (2013.01); *H01L 23/481* (2013.01); *H01L 23/5383* (2013.01); *H01L 23/5384* (2013.01); *H01L 23/5389* (2013.01); *H01L 23/66* (2013.01);
(Continued)

(58) Field of Classification Search
None
See application file for complete search history.

(56) References Cited

U.S. PATENT DOCUMENTS 6,815,739 B2 11/2004 Huff et al.
6,873,529 B2 3/2005 Ikuta et al.
(Continued)

FOREIGN PATENT DOCUMENTS

KR 20150084287 A 7/2015

OTHER PUBLICATIONS

International Search Report and Written Opinion—PCT/US2017/042317—ISA/EPO—dated Oct. 20, 2017.

*Primary Examiner* — Calvin Y Choi
(74) *Attorney, Agent, or Firm* — Loza & Loza, LLP/Qualcomm

(57) ABSTRACT

A package includes a redistribution portion, a first portion, and a second portion. The first portion is coupled to the redistribution portion. The first portion includes a first switch comprising a plurality of switch interconnects, and a first encapsulation layer that at least partially encapsulates the first switch. The second portion is coupled to the first portion. The second portion includes a first plurality of filters. Each filter includes a plurality of filter interconnects. The second portion also includes a second encapsulation layer that at least partially encapsulates the first plurality of filters. The first portion includes a second switch positioned next to the first switch, where the first encapsulation layer at least partially encapsulates the second switch. The second portion includes a second plurality of filters positioned next to the first plurality of filters, where the secod encapsulation layer at least partially encapsulates the second plurality of filters.

20 Claims, 11 Drawing Sheets

(51) Int. Cl.
*H01L 29/40* (2006.01)
*H01L 23/538* (2006.01)
*H01L 21/56* (2006.01)
*H01L 21/768* (2006.01)
*H01L 23/31* (2006.01)
*H01L 23/66* (2006.01)
*H01L 25/07* (2006.01)
*H01L 25/00* (2006.01)
*H03H 1/00* (2006.01)
*H01L 21/48* (2006.01)
*H01L 23/00* (2006.01)
*H01L 23/498* (2006.01)

(52) U.S. Cl.
CPC .............. *H01L 24/19* (2013.01); *H01L 24/24* (2013.01); *H01L 24/97* (2013.01); *H01L 25/072* (2013.01); *H01L 25/50* (2013.01); *H03H 1/0007* (2013.01); *H01L 21/568* (2013.01); *H01L 23/49811* (2013.01); *H01L 2223/6661* (2013.01); *H01L 2224/04105* (2013.01); *H01L 2224/12105* (2013.01); *H01L 2224/19* (2013.01); *H01L 2224/24137* (2013.01); *H01L 2224/24147* (2013.01); *H01L 2224/73267* (2013.01); *H01L 2224/92244* (2013.01); *H01L 2924/19101* (2013.01); *H01L 2924/30111* (2013.01); *H03H 2001/0021* (2013.01)

(56) References Cited

U.S. PATENT DOCUMENTS

| | | | |
|---|---|---|---|
| 7,307,331 | B2 | 12/2007 | Kipnis et al. |
| 7,566,960 | B1* | 7/2009 | Conn .................... H01L 23/055 257/678 |
| 8,611,843 | B2 | 12/2013 | Vogas |
| 8,669,140 | B1* | 3/2014 | Muniandy ............ H01L 25/105 257/774 |
| 8,917,520 | B2 | 12/2014 | Tanaka et al. |
| 2012/0119326 | A1* | 5/2012 | Sugisaki ................ H01G 4/005 257/532 |
| 2012/0273929 | A1* | 11/2012 | Jiang ................ H01L 23/49572 257/673 |
| 2013/0043961 | A1* | 2/2013 | Gebauer ............. H03H 9/0566 333/133 |
| 2013/0242500 | A1* | 9/2013 | Lin ...................... H01L 21/563 361/679.32 |
| 2014/0054760 | A1 | 2/2014 | Yu et al. |
| 2014/0248742 | A1 | 9/2014 | Gonzalez et al. |
| 2015/0016068 | A1* | 1/2015 | Liao ...................... H01L 23/14 361/748 |
| 2016/0044677 | A1* | 2/2016 | King ........................ H04B 1/40 455/450 |
| 2016/0133571 | A1* | 5/2016 | Lee ......................... H01L 21/56 257/774 |
| 2016/0274316 | A1* | 9/2016 | Verdiell ................. G02B 6/428 |

* cited by examiner

PACKAGE COMPRISING SWITCHES AND FILTERS

BACKGROUND

Field of the Disclosure

Various features relate generally to a package, and more specifically to a package that includes switches and filters.

Background

FIG. 1 illustrates a package that includes a substrate 102, a power amplifier (PA) 120, a switch 122, a filter 124 and an antenna switch 126. The power amplifier (PA) 120, the switch 122, the filter 124 and the antenna switch 126 are mounted on the substrate 126. The power amplifier (PA) 120, the switch 122, the filter 124 and the antenna switch 126 are all co-planar to each other on the substrate 102. The power amplifier (PA) 120, the switch 122, the filter 124 and the antenna switch 126 may be mounted over the substrate 102 using a surface mount process. The substrate 102 is mounted over a printed circuit board (PCB) 100. A duplexer 110 is also mounted over the PCB 100.

One downside to the power amplifier (PA) 120, the switch 122, the filter 124 and the antenna switch 126 being co-planar to each other is that the configuration takes up a lot of real estate on the substrate 102. As shown in FIG. 1, the power amplifier (PA) 120, the switch 122, the filter 124 and the antenna switch 126 are spread out over the substrate 102, resulting in a package that has a big surface area.

Another downside to the configuration of FIG. 1, is that the surface mount process that is used to couple the power amplifier (PA) 120, the switch 122, the filter 124 and the antenna switch 126 to the substrate 102 requires a relatively large spacing between components, which further increases the overall surface area of the package that includes the substrate 102.

It is desirable to reduce the size, height and/or spaces of devices and packages, so that these devices and packages can be placed in smaller devices. Ideally, such a device or package will have a better form factor, be cheaper to fabricate, while at the same time meeting the needs and/or requirements of mobile devices, Internet of things (IoT) devices, and/or wearable devices.

SUMMARY

Various features relate generally to a package, and more specifically to a package that includes switches and filters.

One example provides a package that includes a redistribution portion, a first portion, and a second portion. The first portion is coupled to the redistribution portion. The first portion includes a first switch comprising a plurality of switch interconnects, and a first encapsulation layer that at least partially encapsulates the first switch. The second portion is coupled to the first portion. The second portion includes a first plurality of filters, each filter comprising a plurality of filter interconnects. The second portion also includes a second encapsulation layer that at least partially encapsulates the first plurality of filters.

One example provides an apparatus that includes a redistribution portion, a first portion, and a second portion. The first portion is coupled to the redistribution portion. The first portion includes a first switching means comprising a plurality of switch interconnects, and a first encapsulation layer that at least partially encapsulates the first switching means. The second portion is coupled to the first portion. The second portion includes first plurality of filterings means, each filtering means comprising a plurality of filter interconnects. The second portion also includes a second encapsulation layer that at least partially encapsulates the first plurality of filtering means.

Another example provides a method for fabricating a package. The method forms a redistribution portion. The method forms a first portion and couples the first portion to the redistribution portion. Forming the first portion includes providing a first switch that includes a plurality of switch interconnects, and forming a first encapsulation layer that at least partially encapsulates the first switch. The method forms a second portion and couples the second portion to the first portion. Forming the second portion includes providing a first plurality of filters, each filter includes a plurality of filter interconnects. The method forms a second encapsulation layer that at least partially encapsulates the first plurality of filters.

DRAWINGS

Various features, nature and advantages may become apparent from the detailed description set forth below when taken in conjunction with the drawings in which like reference characters identify correspondingly throughout.

DETAILED DESCRIPTION

Figure 1:
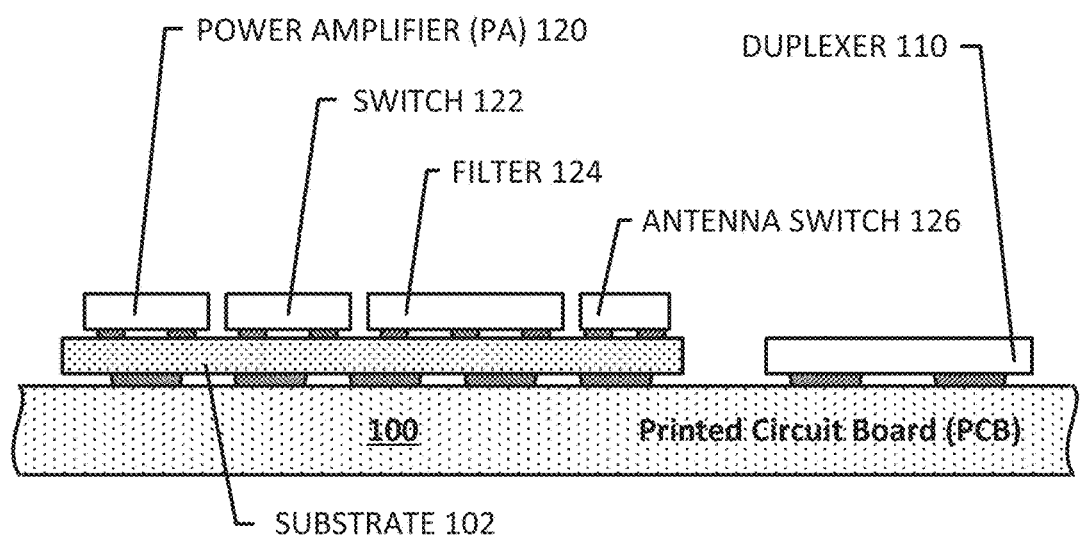
FIG. 1 illustrates a profile view of a package that includes a filter and a switch coupled to a printed circuit board (PCB).

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Some features pertain to a package that includes a redistribution portion, a first portion, and a second portion. The first portion is coupled to the redistribution portion. The first portion includes a first switch comprising a plurality of switch interconnects, and a first encapsulation layer that at least partially encapsulates the first switch. The second portion is coupled to the first portion. The second portion includes a first plurality of filters, each filter comprising a plurality of filter interconnects. The second portion also includes a second encapsulation layer that at least partially encapsulates the first plurality of filters. In some implementations, the first portion further includes a second switch positioned next to the first switch, where the first encapsulation layer at least partially encapsulates the second switch. In some implementations, where the second portion further includes a second plurality of filters positioned next to the first plurality of filters, where the second encapsulation layer at least partially encapsulates the second plurality of filters. In some implementations, where the second portion further includes a through encapsulation interconnect that travels through the second portion. The through encapsulation interconnect is configured to provide an electrical path between the first plurality of filters and the redistribution portion.

In some implementations, the height of the package may be defined along the Z-direction of the package, which is shown in the figures of the present disclosure. In some implementations, the Z-direction of the package may be defined along an axis between a top portion and a bottom portion of the package. The terms top and bottom may be arbitrarily assigned, however as an example, the top portion of the package may be a portion comprising an encapsulation layer, while a bottom portion of the package may be a portion comprising a redistribution portion or a plurality of solder balls. In some implementations, the top portion of the package may be a back side of the package, and the bottom portion of the package may be a front side of the package. The front side of the package may be an active side of the package. A top portion may be a higher portion relative to a lower portion. A bottom portion may be a lower portion relative to a higher portion. Further examples of top portions and bottom portions will be further described below. The X-Y directions of the package may refer to the lateral direction and/or footprint of the package. Examples of X-Y directions are shown in the figures of the present disclosure and/or further described below. In many of the figures of the present disclosure, the packages and their respective components are shown across a X-Z cross-section or X-Z plane. However, in some implementations, the packages and their representative components may be represented across a Y-Z cross-section or Y-Z plane.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. In some implementations, an interconnect is an electrically conductive material that may be configured to provide an electrical path for a signal (e.g., data signal, ground signal, power signal). An interconnect may be part of a circuit. An interconnect may include more than one element or component.

Exemplary Package Comprising Switches and Filters

Figure 2:
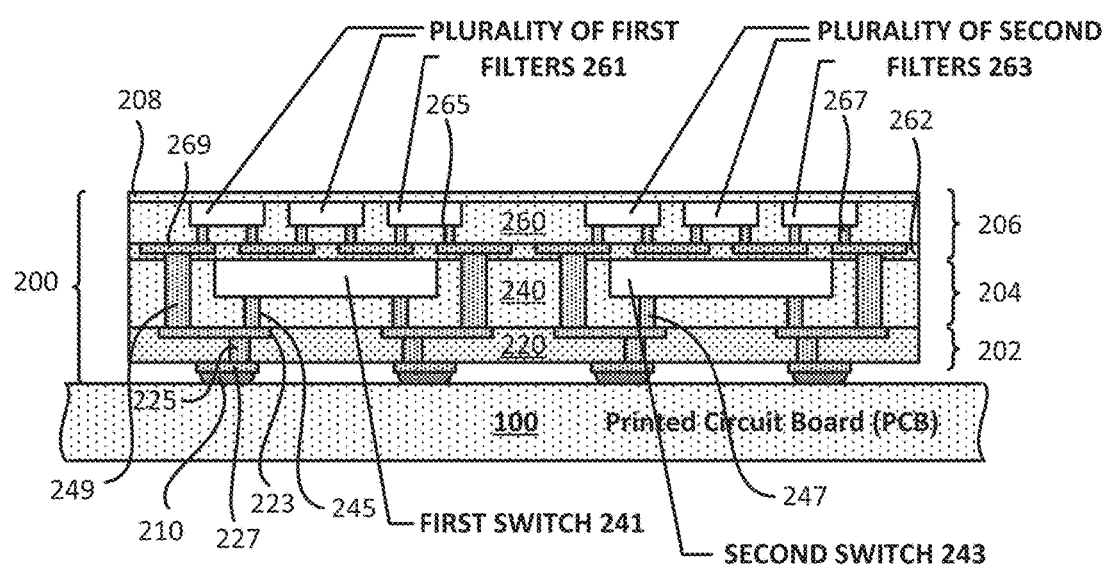
FIG. 2 illustrates a profile view of a package that includes several filters and several switches, where filters are positioned over the switches.

FIG. 2 illustrates a package 200 coupled to a printed circuit board (PCB) 100 through a plurality of solder interconnects 210. As will be further described below, the package 200 includes a plurality of switches (e.g., means for switching, switching means) and a plurality of filters (e.g., means for filtering, filtering means). These switches and filters may be positioned co-planar and/or over each other in such a way as to minimize the overall size of the package 200. The spacing between at least some of the neighboring switches and/or neighboring filters may be about 100 microns (μm) or less. In some implementations, the spacing between at least some of the neighboring switches and/or neighboring filters may be about 50 microns (μm) or less. Although not shown, the package 200 may be electrically coupled to other components and/or devices, such as an integrated device (e.g., chip, die). The package 200 may be configured to provide radio frequency (RF) filters and switches.

The package 200 includes a redistribution portion 202, a first portion 204 and a second portion 206. The redistribution portion 202 includes at least one dielectric layer 220, a plurality of first redistribution interconnects 223, a plurality of second redistribution interconnects 225 and a plurality of third redistribution interconnects 227. The plurality of first redistribution interconnects 223 may include traces and/or pads. The plurality of second redistribution interconnects 225 may include vias. The plurality of third redistribution interconnects 227 may include pads. The plurality of first redistribution interconnects 223 is coupled to the plurality of second redistribution interconnects 225. The plurality of second redistribution interconnects 225 is coupled to the plurality of third redistribution interconnects 227. The plurality of third redistribution interconnects 227 is coupled to the plurality of solder interconnects 210.

FIG. 2 illustrates that the first portion 204 is coupled to the redistribution portion 202. The first portion 204 may be a switching portion. The first portion 204 includes a first encapsulation layer 240, a first switch 241 (e.g., means for first switching, first switching means), a second switch 243 (e.g., means for second switching, second switching means), a plurality of first switch interconnects 245, a plurality of second switch interconnects 247 and a plurality of through encapsulation interconnects 249. The first encapsulation layer 240 at least partially encapsulates the first switch 241, the second switch 243, the plurality of first switch interconnects 245, a plurality of second switch interconnects 247 and the plurality of through encapsulation interconnects 249. The plurality of first switch interconnects 245 and the plurality of through encapsulation interconnects 249 are coupled to the plurality of first redistribution interconnects 223. The plurality of first switch interconnects 245 and the plurality of second switch interconnects 247 are coupled to the plurality of through encapsulation interconnects 249 through the plurality of first redistribution interconnects 223. The plurality of through encapsulation interconnects 249 travels entirely through the first encapsulation layer 240. The plurality of through encapsulation interconnects 249 may include interconnect posts (e.g., copper (Cu) posts).

The first switch 241 is substantially co-planar to the second switch 243 in the first portion 204. However, in some implementations, the first switch 241 and the second switch 243 may be positioned differently in the first portion 204.

FIG. 2 illustrates that the second portion 206 is coupled to the first portion 204. The second portion 206 may be a filtering portion. The second portion 206 includes a second encapsulation layer 260, a plurality of first filters 261, a plurality of second filters 263, a plurality of first filter interconnects 265, a plurality of second filter interconnects 267, a passivation layer 262 and a plurality of interconnects 269.

The second encapsulation layer 260 at least partially encapsulates the plurality of first filters 261 (e.g., means for first filtering, first filtering means), the plurality of second filters 263 (e.g., means for second filtering, second filtering means), the plurality of first filter interconnects 265 and the plurality of second filter interconnects 267. The plurality of first filters 261 is coupled to the plurality of interconnects 269 through the plurality of first filter interconnects 265. The plurality of second filters 263 is coupled to the plurality of interconnects 269 through the plurality of second filter interconnects 267. The plurality of interconnects 269 is coupled to the plurality of through encapsulation interconnects 249. The passivation layer 262 at least partially covers the plurality of interconnects 269. The plurality of first filters 261 are positioned substantially over the first switch 241. The plurality of second filters 263 are positioned substantially over the second switch 243.

As shown in FIG. 2, at least some of the first filters from the plurality of first filters 261 are positioned in the second portion 206 such that the first filters are substantially co-planar to each other. In some implementations, at least some of the neighboring first filters from the plurality of first filters 261 have a spacing that is about 100 microns (µm) or less. In some implementations, the spacing between at least some of neighboring first filters may be about 50 microns (µm) or less.

At least some of the second filters from the plurality of second filters 263 are positioned in the second portion 206 such that the second filters are substantially co-planar to each other. In some implementations, at least some of the neighboring second filters from the plurality of second filters 263 have a spacing that is about 100 microns (µm) or less. In some implementations, the spacing between at least some of neighboring first filters may be about 50 microns (µm) or less.

In some implementations, the small spacing is enabled through a fabrication process that allows filters (e.g., means for filtering, filtering means) to be placed close to each other while still being able to keep the alignment of interconnects under control and within tolerances. The small spacing further enables a package 200 that includes a small form factor.

Another advantage of positioning the switches and filters close to each other in the package is that no impedance matching may be required (due to their proximity to each other), in some implementations. In instances where impedance matching may be desired, some of the interconnects between the switches and filters can be configured for impedance matching, instead of having a separate device or component to provide impedance matching between the switches and filters. For example, some of the plurality of through encapsulation interconnects 249, the plurality of first redistribution interconnects 223, and/or the plurality of second redistribution interconnects 225 may be configured to provide impedance matching between the filters (e.g., first filter) and switches (e.g., first switch 241), thus bypassing the need for a separate impedance matching device or component.

In some implementations, some interconnects from the plurality of through encapsulation interconnects 249, the plurality of first redistribution interconnects 223, and/or the plurality of second redistribution interconnects 225 may be configured to provide one or more first impedance matching (e.g., means for first impedance matching) between the plurality of first filters 261 and the first switch 241, and/or some interconnects from the plurality of through encapsulation interconnects 249, the plurality of first redistribution interconnects 223, and/or the plurality of second redistribution interconnects 225 may be configured to provide one or more second impedance matching (e.g., means for second impedance matching) between the plurality of second filters 263 and the second switch 243.

In some implementations, the package 200 may include an adhesive layer 208, which is optional. The adhesive layer 208 is coupled to the second encapsulation layer 260. The adhesive layer 208 may cover the plurality of first filters 261 and the plurality of second filters 263. In some implementations, the adhesive layer 208 is a result of the fabrication process that fabricates the package 200.

It is noted that different implementations may include different numbers of switches and filters (e.g., one switch and several filters). Thus, the package 200 of FIG. 2 is merely exemplary, and different implementations may have other configurations and/or combinations of switches and filters.

Exemplary Package Comprising Switches and Filters

Figure 3:
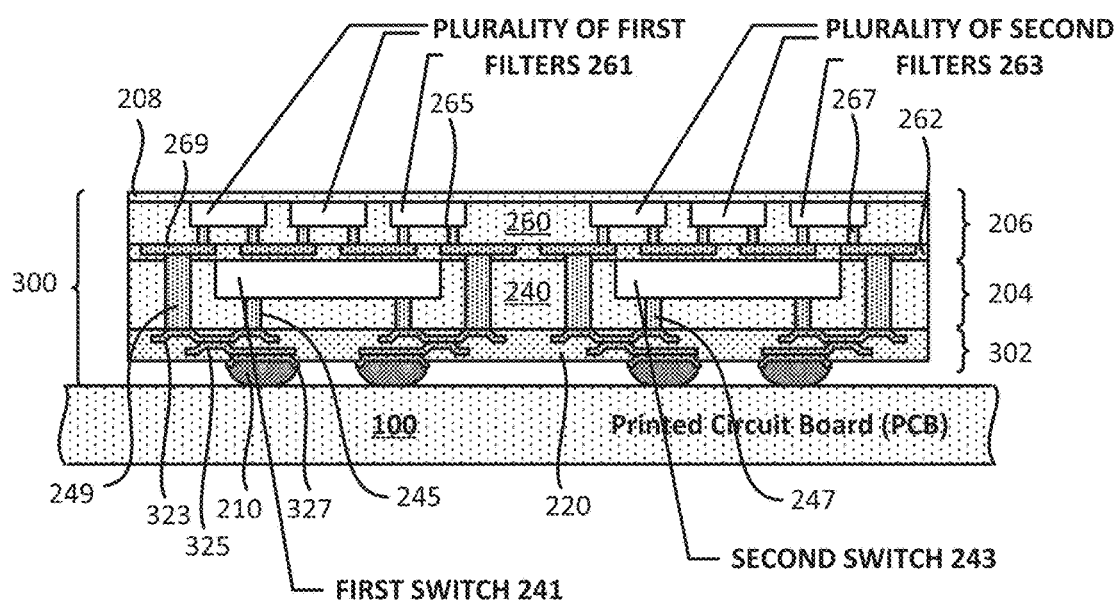
FIG. 3 illustrates a profile view of another package that includes several filters and several switches, where filters are positioned over the switches.

FIG. 3 illustrates another configuration of a package that includes switches and filters. More specifically, FIG. 3 illustrates a package 300 that includes switches and filters. The package 300 is similar to the package 200 of FIG. 2. The package 300 includes similar components as the package 200. The package 300 is coupled to the PCB 100 through the plurality of solder interconnects 210. Although not shown, the package 300 may be electrically coupled to other components and/or devices, such as an integrated device (e.g., chip, die). The package 300 may be configured to provide radio frequency (RF) filters and switches.

The package 300 includes a redistribution portion 302, the first portion 204 and the second portion 206. The package 200 also includes the first switch 241, the second switch 243, the plurality of first filters 261 and the plurality of second filters 263. The redistribution portion 302 is coupled to the first portion 204. The first portion 204 is coupled to the second portion 206. The redistribution portion 302 includes at least one dielectric layer 220, a plurality of first redistribution interconnects 323, a plurality of second redistribution interconnects 325 and a plurality of under bump metallization (UBM) layers 327. The plurality of first redistribution interconnects 323, the plurality of second redistribution interconnects 325 and the plurality of under bump metallization (UBM) layers 327 may include portions that are U shaped and/or V shaped.

The plurality of first redistribution interconnects 323 is coupled to the plurality of second redistribution interconnects 325. The plurality of second redistribution interconnects 325 is coupled to the plurality of under bump metallization (UBM) layers 327. The plurality of UBM layers 327 is coupled to the plurality of solder interconnects 210.

The plurality of first redistribution interconnects 323 is coupled to the plurality of first switch interconnects 245 and the plurality of second switch interconnects 247. The plurality of first redistribution interconnects 323 is coupled to the plurality of through encapsulation interconnects 249.

FIG. 3 illustrates that at least some of the first filters from the plurality of first filters 261 are positioned in the second portion 206 such that the first filters are substantially co-planar to each other. In some implementations, at least some of the neighboring first filters from the plurality of first filters 261 have a spacing that is about 100 microns (µm) or less. In some implementations, the spacing between at least some of neighboring first filters may be about 50 microns (µm) or less.

FIG. 3 also illustrates that at least some of the second filters from the plurality of second filters 263 are positioned in the second portion 206 such that the second filters are substantially co-planar to each other. In some implementations, at least some of the neighboring second filters from the plurality of second filters 263 have a spacing that is about 100 microns (µm) or less. In some implementations, the spacing between at least some of neighboring first filters may be about 50 microns (µm) or less.

In some implementations, the small spacing is enabled through a fabrication process that allows filters (e.g., means for filtering, filtering means) to be placed close to each other while still being able to keep the alignment of interconnects under control and within tolerances. The small spacing further enables a package 300 that includes a small form factor.

As mentioned above, another advantage of positioning the switches and filters close to each other in the package is that no impedance matching may be required (due to their proximity to each other), in some implementations. In instances where impedance matching may be desired, some of the interconnects between the switches and filters can be configured for impedance matching, instead of having a separate device or component to provide impedance matching between the switches and filters. For example, some of the plurality of through encapsulation interconnects 249, the plurality of first redistribution interconnects 323, and/or the plurality of second redistribution interconnects 325 may be configured to provide impedance matching between the filters (e.g., first filter) and switches (e.g., first switch 241), thus bypassing the need for a separate impedance matching device or component.

In some implementations, some interconnects from the plurality of through encapsulation interconnects 249, the plurality of first redistribution interconnects 323, and/or the plurality of second redistribution interconnects 325 may be configured to provide one or more first impedance matching (e.g., means for first impedance matching) between the plurality of first filters 261 and the first switch 241, and/or some interconnects from the plurality of through encapsulation interconnects 249, the plurality of first redistribution interconnects 323, and/or the plurality of second redistribution interconnects 325 may be configured to provide one or more second impedance matching (e.g., means for second impedance matching) between the plurality of second filters 263 and the second switch 243.

It is noted that different implementations may include different numbers of switches and filters (e.g., one switch and several filters). Thus, the package 300 of FIG. 3 is merely exemplary, and different implementations may have other configurations and/or combinations of switches and filters.

Having described various examples of packages that include switches and filters, various processes and methods for fabricating a package that includes switches and filters will now be described.

Exemplary Sequence for Fabricating a Package Comprising Switches and Filters

Figure 4A:
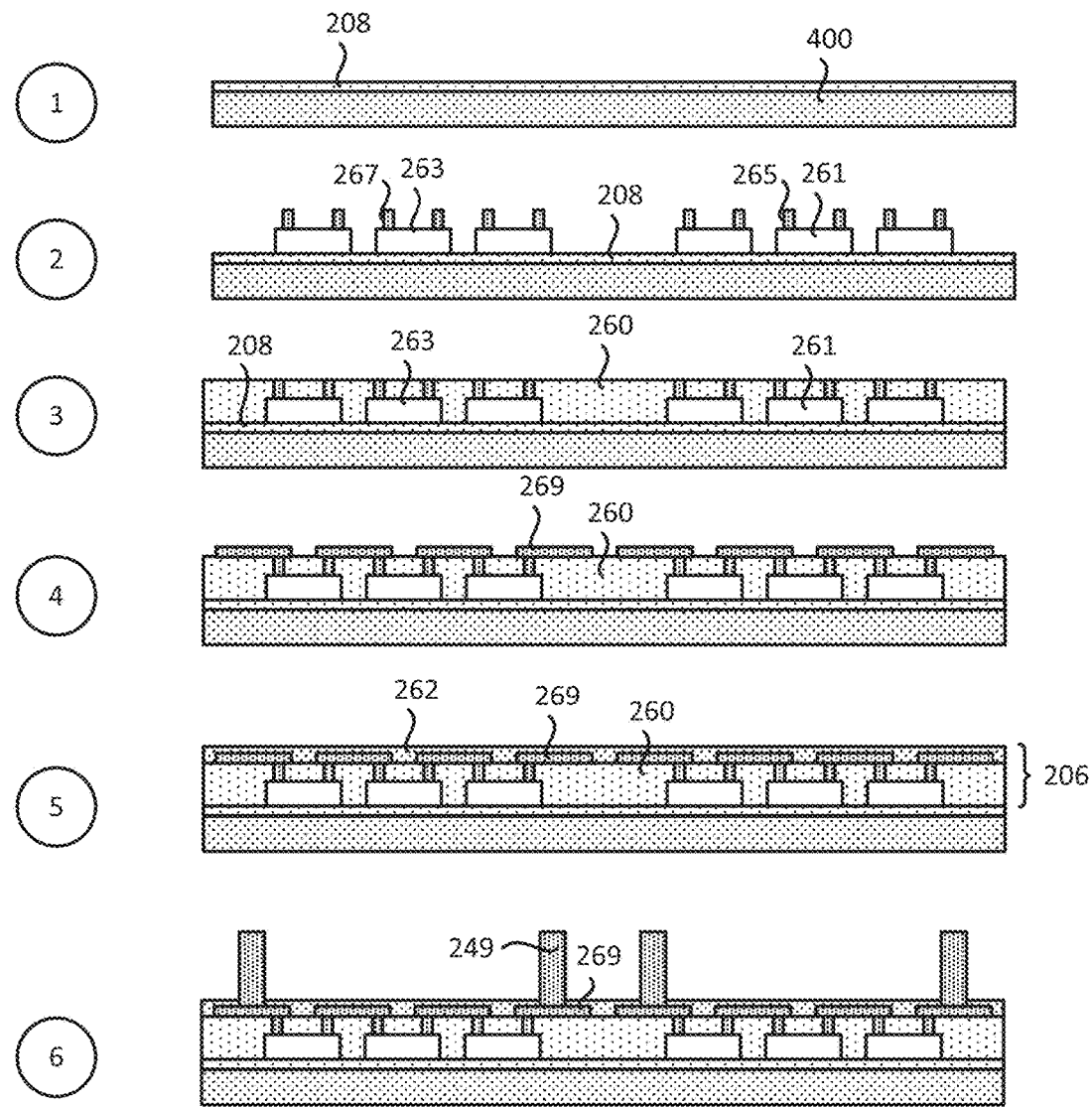
FIG. 4 (which includes FIGS. 4A-4C) illustrates an example of a sequence for fabricating a package that includes several filters and several switches, where filters are positioned over the switches.
Figure 4B:
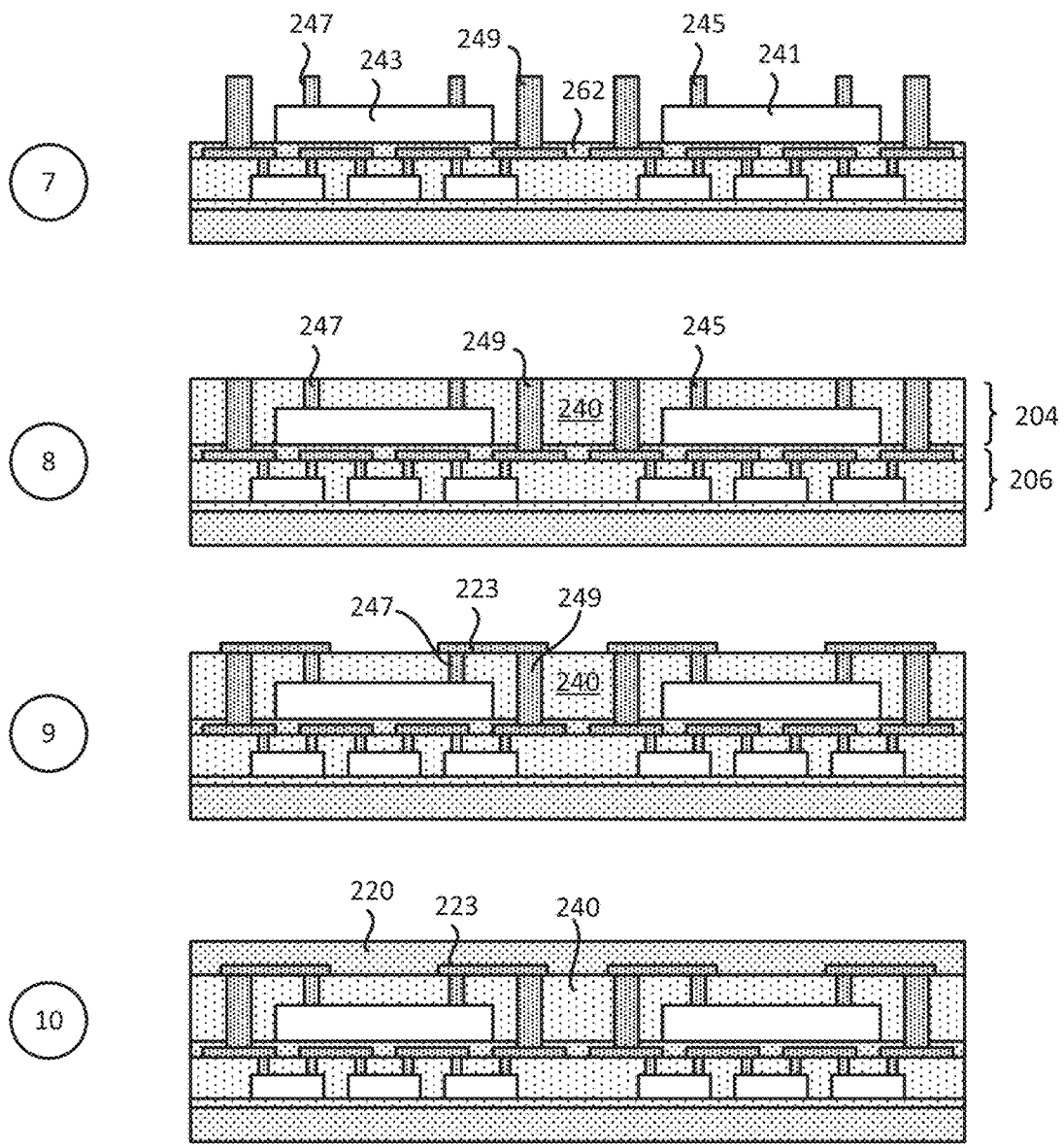
Figure 4C:
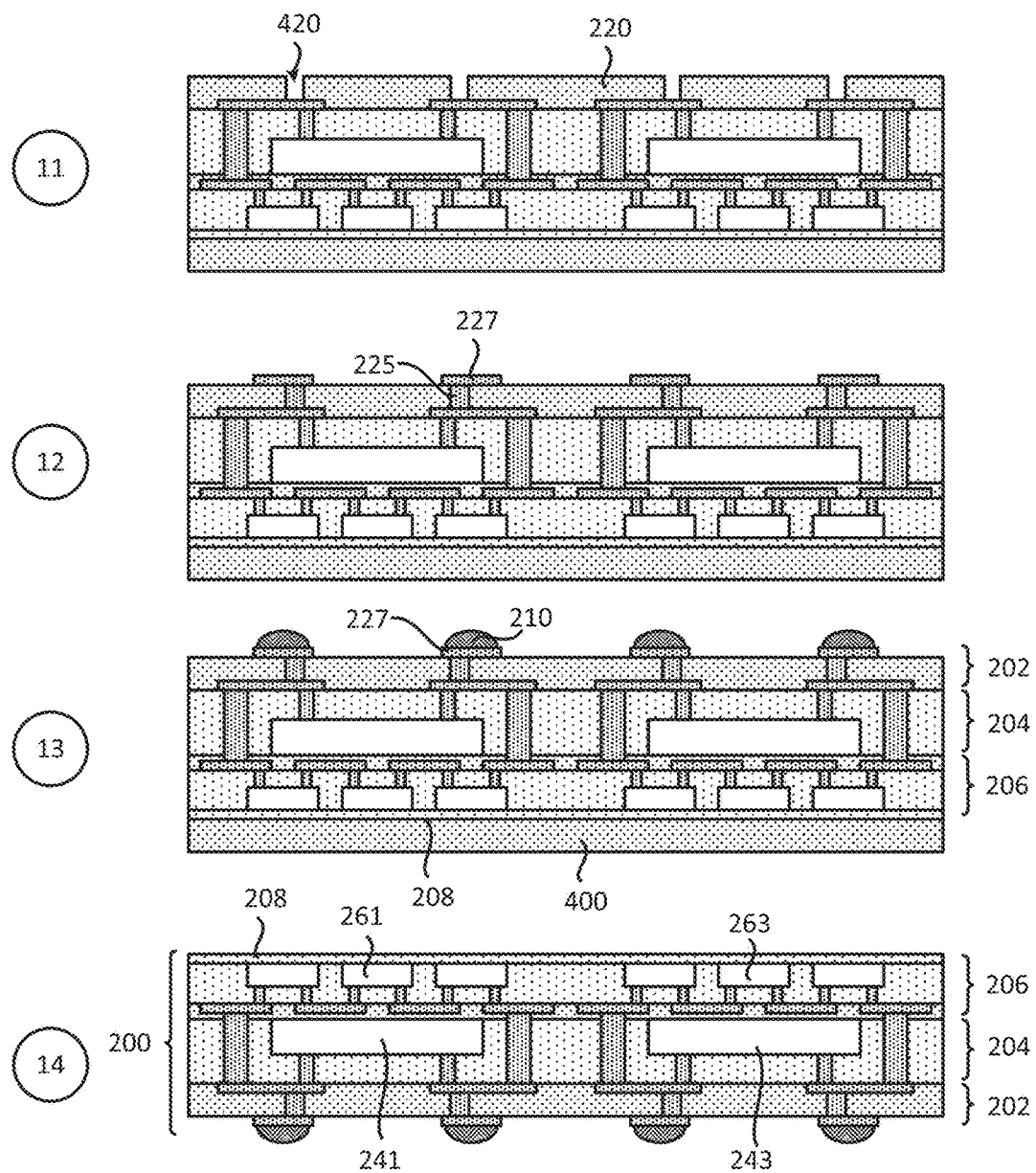

In some implementations, providing/fabricating a package that includes switches and filters includes several processes. FIG. 4 (which includes FIGS. 4A-4C) illustrates an exemplary sequence for providing/fabricating a package that includes switches and filters. In some implementations, the sequence of FIGS. 4A-4C may be used to fabricate the package that includes switches and filters of FIG. 2 and/or other packages described in the present disclosure. However, for the purpose of simplification, FIGS. 4A-4C will be described in the context of fabricating a package of FIG. 2. In particular, FIGS. 4A-4C will be described in the context of fabricating the package 200 of FIG. 2.

It should be noted that the sequence of FIGS. 4A-4C may combine one or more stages in order to simplify and/or clarify the sequence for providing a package. In some implementations, the order of the processes may be changed or modified.

Stage 1, as shown in FIG. 4A, illustrates a state after a carrier 400 and an adhesive layer 208 are provided. The adhesive layer 208 is formed over the carrier 400. Different implementations may use different materials for the carrier 400. In some implementations, the carrier 400 includes glass and/or silicon.

Stage 2 illustrates a state after the plurality of first filters 261 and the plurality of second filters 263 are placed over the adhesive layer 208 using a pick and place process. In some implementations, the filters are places that such at least some of the neighboring filters (from the plurality of first filters 261, the plurality of second filters 263) have a spacing that is about 100 microns (μm) or less. In some implementations, the spacing between at least some of neighboring filters may be about 50 microns (μm) or less.

Stage 3 illustrates a state after the second encapsulation layer 260 is formed over the adhesive layer 208, the plurality of first filters 261, the plurality of second filters 263, the plurality of first filter interconnects 265 and the plurality of second filter interconnects 267. The second encapsulation layer 260 may include a mold compound and/or epoxy fill. In some implementations, the second encapsulation layer 260 may be formed such as to at least partially encapsulate the plurality of first filters 261, the plurality of second filters 263, the plurality of first filter interconnects 265 and the plurality of second filter interconnects 267. In some implementations, the second encapsulation layer 260 is formed over the plurality of first filters 261, the plurality of second filters 263, the plurality of first filter interconnects 265 and the plurality of second filter interconnects 267 and portions of the second encapsulation layer 260 is removed (e.g., grinded).

Stage 4 illustrates a state after the plurality of interconnects 269 is formed over the second encapsulation layer 260. The plurality of interconnects 269 is formed such as to couple to the plurality of first filter interconnects 265 and the plurality of second filter interconnects 267. In some implementations, the plurality of interconnects 269 is formed using a plating process (e.g., Damascene, Semi Additive Process (SAP)).

Stage 5 illustrates a state after the passivation layer 242 is formed over the second encapsulation layer 260 and the plurality of interconnects 269. In some implementations, stage 5 illustrates the second portion 206 of a package 200.

Stage 6 illustrates a state after the plurality of through encapsulation interconnects 249 is formed over the plurality of interconnects 269. In some implementations, the plurality of through encapsulation interconnects 249 is formed by removing portions of the passivation layer 262 and using a plating process to form the plurality of through encapsulation interconnects 249. The plurality of through encapsulation interconnects 249 may include copper (Cu) posts.

Stage 7, as shown in FIG. 4B, illustrates a state after the first switch 241 and the second switch 243 is placed aver the passivation layer 262.

Stage 8 illustrates a state after the first encapsulation layer 240 is formed over the passivation layer 262, the first switch 241, the second switch 243, the plurality of first switch interconnects 245, the plurality of second switch interconnects 247 and the plurality of through encapsulation interconnects 249. The first encapsulation layer 240 may include a mold compound and/or epoxy fill. In some implementations, the first encapsulation layer 240 may be formed such as to at least partially encapsulate the first switch 241, the second switch 243, the plurality of first switch interconnects 245 and the plurality of second switch interconnects 247. In some implementations, the first encapsulation layer 240 is formed over the first switch 241, the second switch 243, the plurality of first switch interconnects 245 and the plurality of second switch interconnects 247 and portions of the first encapsulation layer 240 is removed (e.g., grinded).

Stage 9 illustrates a state after the plurality of first redistribution interconnects 223 is formed over the first encapsulation layer 240. The plurality of first redistribution interconnects 223 is formed such as to couple to the plurality of through encapsulation interconnects 249, the plurality of first switch interconnects 245 and the plurality of second switch interconnects 247. A plating process may be used to form the plurality of first redistribution interconnects 223.

Stage 10 illustrates a state after the at least one dielectric layer 220 is formed over the first encapsulation layer 240 and the plurality of first redistribution interconnects 223.

Stage 11, as shown in FIG. 4C, illustrates a state after a plurality of cavities 420 is formed in the at least one dielectric layer 220.

Stage 12 illustrates a state after the plurality of second redistribution interconnects 225 is formed in the plurality of cavities 420, and the plurality of third redistribution interconnects 227 is formed over the at least one dielectric layer 220. A plating process may be used to form the plurality of second redistribution interconnects 225 and the plurality of third redistribution interconnects 227.

Stage 13 illustrates a state after the plurality of solder interconnects 210 is provided over the plurality of third redistribution interconnects 227.

Stage 14 illustrates a state after the carrier 400 is removed (e.g., grinded) from the package 200. In some implementations, the adhesive layer 208 is also removed (e.g., grinded) from the package 200.

In some implementations, several first packages are concurrently fabricated on a wafer, and a singulation process is performed to cut the wafer into individual packages.

Exemplary Sequence for Fabricating a Package Comprising Switches and Filters

Figure 5A:
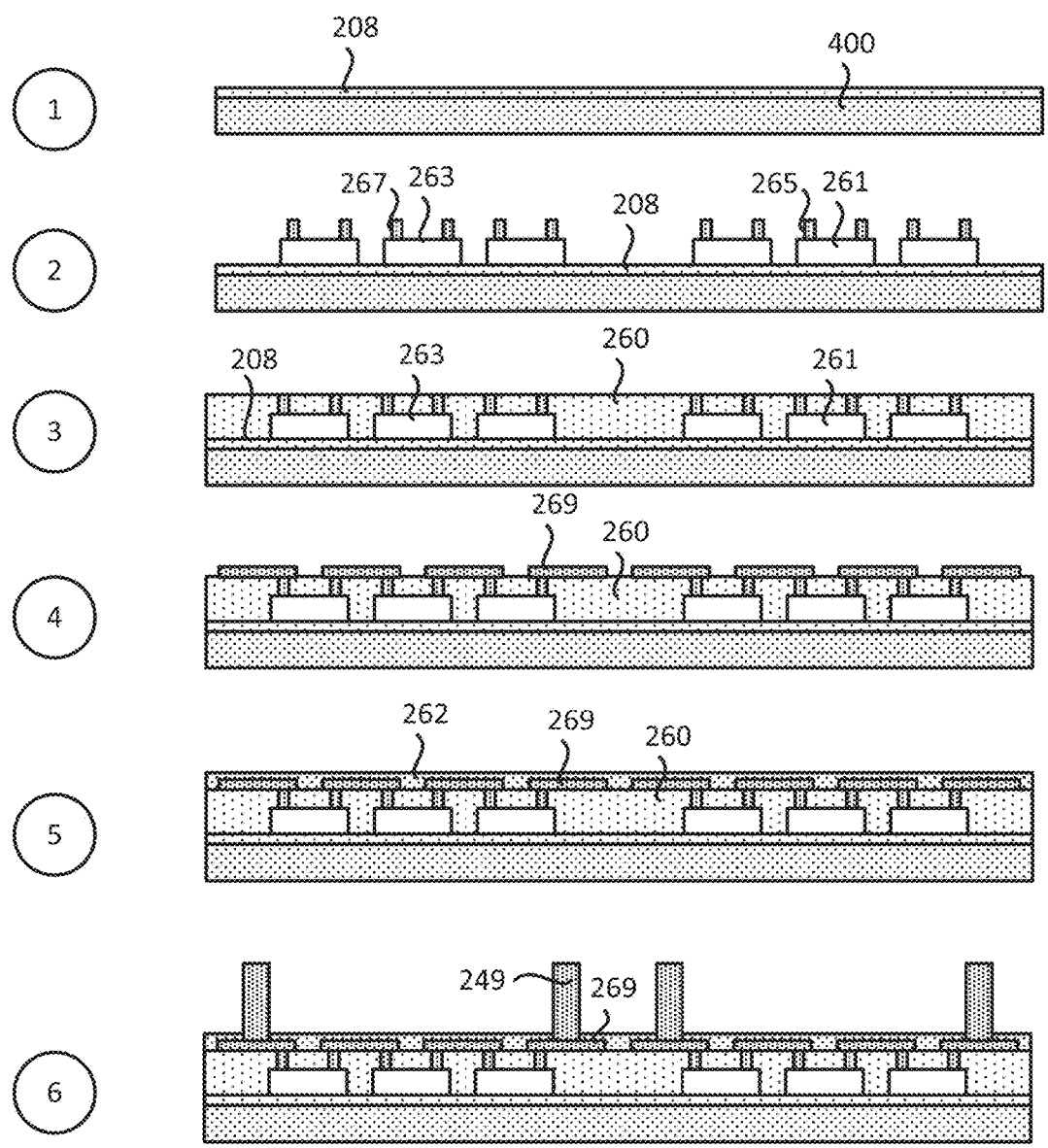
FIG. 5 (which includes FIGS. 5A-5C) illustrates an example of a sequence for fabricating a package that includes several filters and several switches, where filters are positioned over the switches.
Figure 5B:
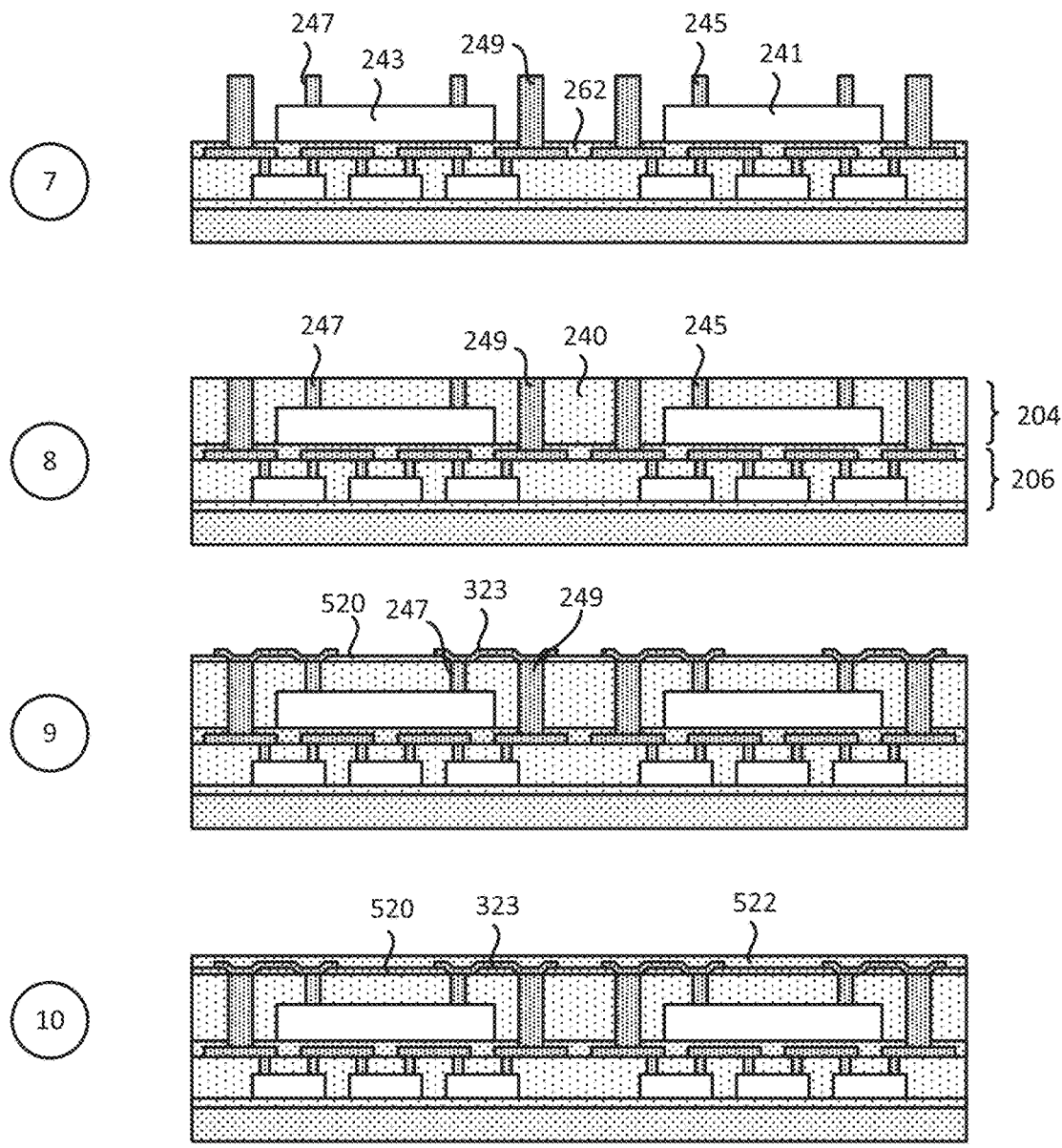
Figure 5C:
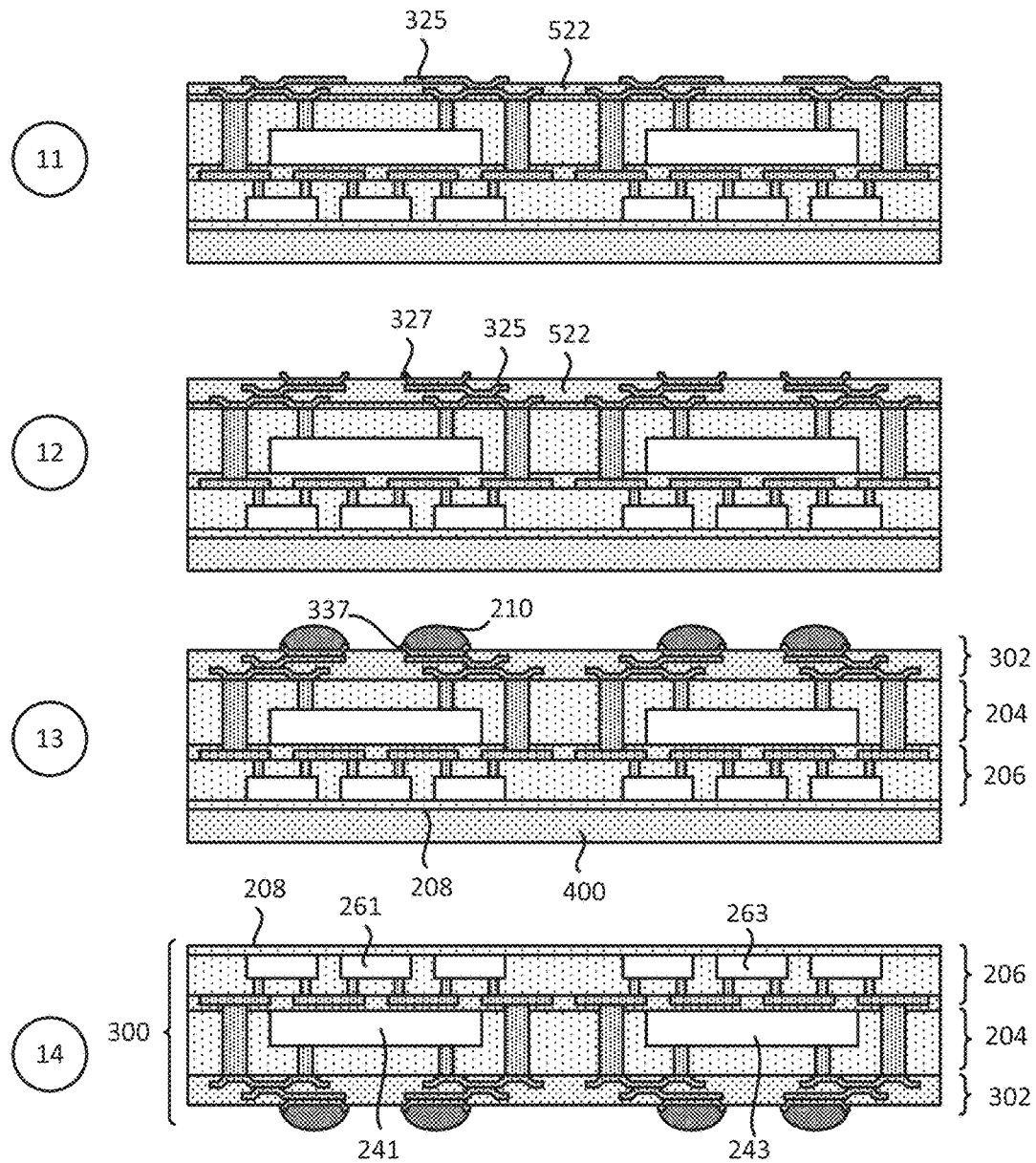

In some implementations, providing/fabricating a package that includes switches and filters includes several processes. FIG. 5 (which includes FIGS. 5A-5C) illustrates an exemplary sequence for providing/fabricating a package that includes switches and filters. In some implementations, the sequence of FIGS. 5A-5C may be used to fabricate the package that includes switches and filters of FIG. 3 and/or other packages described in the present disclosure. However, for the purpose of simplification, FIGS. 5A-5C will be described in the context of fabricating a package of FIG. 3. In particular, FIGS. 5A-5C will be described in the context of fabricating the package 300 of FIG. 3.

It should be noted that the sequence of FIGS. 5A-5C may combine one or more stages in order to simplify and/or clarify the sequence for providing a package. In some implementations, the order of the processes may be changed or modified.

Stage 1, as shown in FIG. 5A, illustrates a state after a carrier 400 and an adhesive layer 208 are provided. The adhesive layer 208 is formed over the carrier 400. Different implementations may use different materials for the carrier 400. In some implementations, the carrier 400 includes glass and/or silicon.

Stage 2 illustrates a state after the plurality of first filters 261 and the plurality of second filters 263 are placed over the adhesive layer 208 using a pick and place process. In some implementations, the filters are places that such at least some of the neighboring filters (from the plurality of first filters 261, the plurality of second filters 263) have a spacing that is about 100 microns (μm) or less. In some implementations, the spacing between at least some of neighboring filters may be about 50 microns (μm) or less.

Stage 3 illustrates a state after the second encapsulation layer 260 is formed over the adhesive layer 208, the plurality of first filters 261, the plurality of second filters 263, the plurality of first filter interconnects 265 and the plurality of second filter interconnects 267. The second encapsulation layer 260 may include a mold compound and/or epoxy fill. In some implementations, the second encapsulation layer 260 may be formed such as to at least partially encapsulate the plurality of first filters 261, the plurality of second filters 263, the plurality of first filter interconnects 265 and the plurality of second filter interconnects 267. In some implementations, the second encapsulation layer 260 is formed over the plurality of first filters 261, the plurality of second filters 263, the plurality of first filter interconnects 265 and the plurality of second filter interconnects 267 and portions of the second encapsulation layer 260 is removed (e.g., grinded).

Stage 4 illustrates a state after the plurality of interconnects 269 is formed over the second encapsulation layer 260. The plurality of interconnects 269 is formed such as to couple to the plurality of first filter interconnects 265 and the plurality of second filter interconnects 267. In some implementations, the plurality of interconnects 269 is formed using a plating process (e.g., Damascene, Semi Additive Process (SAP)).

Stage 5 illustrates a state after the passivation layer 242 is formed over the second encapsulation layer 260 and the plurality of interconnects 269. In some implementations, stage 5 illustrates the second portion 206 of a package 200.

Stage 6 illustrates a state after the plurality of through encapsulation interconnects 249 is formed over the plurality of interconnects 269. In some implementations, the plurality of through encapsulation interconnects 249 is formed by removing portions of the passivation layer 262 and using a plating process to form the plurality of through encapsulation interconnects 249. The plurality of through encapsulation interconnects 249 may include copper (Cu) posts.

Stage 7, as shown in FIG. 5B, illustrates a state after the first switch 241 and the second switch 243 is placed over the passivation layer 262.

Stage 8 illustrates a state after the first encapsulation layer 240 is formed over the passivation layer 262, the first switch 241, the second switch 243, the plurality of first switch interconnects 245, the plurality of second switch interconnects 247 and the plurality of through encapsulation interconnects 249. The first encapsulation layer 240 may include a mold compound and/or epoxy fill. In some implementations, the first encapsulation layer 240 may be formed such as to at least partially encapsulate the first switch 241, the second switch 243, the plurality of first switch interconnects 245 and the plurality of second switch interconnects 247. In some implementations, the first encapsulation layer 240 is formed over the first switch 241, the second switch 243, the plurality of first switch interconnects 245 and the plurality of second switch interconnects 247 and portions of the first encapsulation layer 240 is removed (e.g., grinded).

Stage 9 illustrates a state after a dielectric layer 520 and the plurality of first redistribution interconnects 323 is formed over the first encapsulation layer 240. The plurality of first redistribution interconnects 323 is formed such as to couple to the plurality of through encapsulation interconnects 249, the plurality of first switch interconnects 245 and the plurality of second switch interconnects 247. A plating process may be used to form the plurality of first redistribution interconnects 323.

Stage 10 illustrates a state after a dielectric layer 522 is formed over the dielectric layer 522 and the plurality of first redistribution interconnects 323. In some implementations, the dielectric layer 520 and the dielectric layer 522 may represent the at least one dielectric layer 220.

Stage 11, as shown in FIG. 5C, illustrates a state after the plurality of second redistribution interconnects 325 is formed over the dielectric layer 522 and the plurality of first redistribution interconnects 323. A plating process may be used to form the plurality of second redistribution interconnects 325.

Stage 12 illustrates a state after the plurality of UBM layers 327 are formed over the plurality of second redistribution interconnects 325. A plating process may be used to form the plurality of UBM layers 327.

Stage 13 illustrates a state after the plurality of solder interconnects 210 is provided over the plurality of UBM layers 327.

Stage 14 illustrates a state after the carrier 400 is removed (e.g., grinded) from the package 300. In some implementations, the adhesive layer 208 is also removed grinded) from the package 300.

In some implementations, several first packages are concurrently fabricated on a wafer, and a singulation process is performed to cut the wafer into individual packages.

Exemplary Method for Fabricating a Package Comprising Switches and Filters

Figure 6:
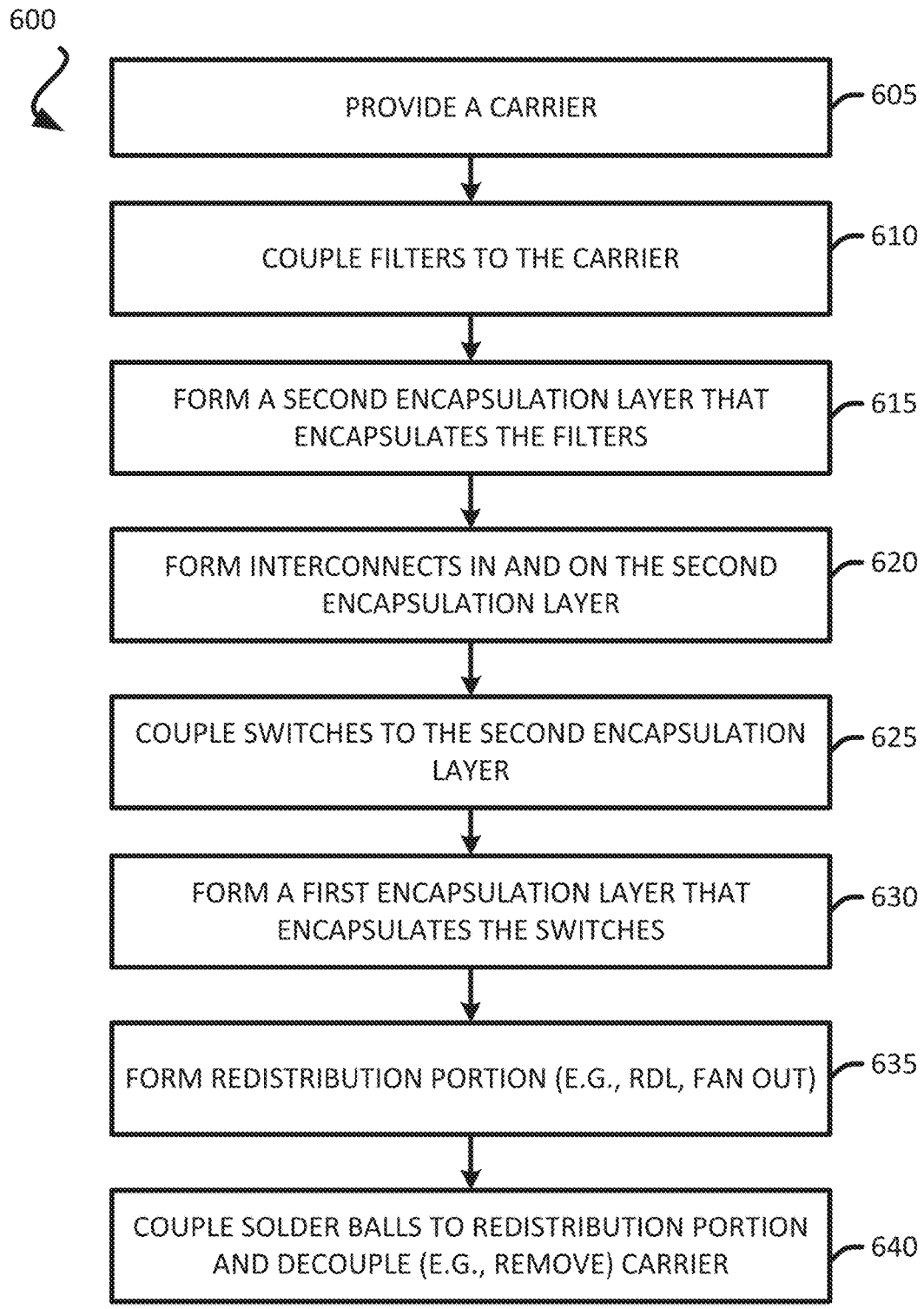
FIG. 6 illustrates a flow diagram of an exemplary method for fabricating a package that includes several filters and several switches, where filters are positioned over the switches.

In some implementations, providing/fabricating a package that includes switches and filters includes several processes. FIG. 6 illustrates an exemplary flow diagram of a method for fabricating package that includes switches and filters. In some implementations, the method of FIG. 6 may be used to fabricate the package of FIGS. 2-3 and/or other packages described in the present disclosure. However, for the purpose of simplification, FIG. 6 will be described in the context of fabricating the package of FIG. 2.

It should be noted that the flow diagram of FIG. 6 may combine one or more processes in order to simplify and/or clarify the method for providing a package. In some implementations, the order of the processes may be changed or modified.

The method provides (at 605) a carrier (e.g., carrier 400). The carrier may also include an adhesive layer (e.g., adhesive layer 208). In some implementations, the adhesive layer is formed over the carrier. Different implementations may use different materials for the carrier. In some implementations, the carrier may include glass and/or silicon.

The method couples (at 610) a plurality of filters (e.g., 261, 263) to the carrier (e.g., 400). In some implementations, a pick and place process is used to couple the filters to the carrier, which may include the adhesive layer. In some implementations, the filters are places that such at least sonic of the neighboring filters (from the plurality of first filters 261, the plurality of second filters 263) have a spacing that is about 100 microns (μm) or less. In some implementations, the spacing between at least some of neighboring filters may be about 50 microns (μm) or less.

The method forms (at 615) a second encapsulation layer (e.g., second encapsulation layer 260) over the adhesive layer, the filters (e.g., the plurality of first filters 261, the plurality of second filters 263) and the filter interconnects (e.g., the plurality of first filter interconnects 265 and the plurality of second filter interconnects 267). The second encapsulation layer may include a mold compound and/or epoxy fill.

The method forms (at 620) a plurality of interconnects in and over the second encapsulation layer 260. The plurality of interconnects may include the plurality of interconnects 269 and the plurality of through encapsulation interconnects 249. The plurality of through encapsulation interconnects 249 may include copper (Cu) posts.

The method provides (at 625) switches (e.g., first switch 241, the second switch 243) over the second encapsulation layer. In some implementations, providing the switches includes providing the switches over a passivation layer (e.g., passivation layer 262) located of the second encapsulation layer 260.

The method forms (at 630) a first encapsulation layer (e.g., first encapsulation layer 240) the passivation layer, the switches (e.g., first switch 241, the second switch 243), the switch interconnects (e.g., plurality of first switch interconnects 245, the plurality of second switch interconnects 247) and the plurality of through encapsulation interconnects 249. The first encapsulation layer may include a mold compound and/or epoxy fill.

The method forms (at 625) a redistribution portion over the first encapsulation layer. Different implementations may form the redistribution portion differently. In some implementations, forming a redistribution portion includes forming at least one dielectric layer and forming at least one redistribution interconnect. Examples of forming redistribution portions are illustrated and described in stages 9-13 of FIGS. 4B-4C, and stages 9-13 of FIGS. 5B-5C.

The method provides (at 640) a plurality of solder interconnects (e.g., solder balls, solder interconnects 210) to the redistribution portion, and decouples (at 640) the carrier. In some implementations, the adhesive layer is also decoupled.

Exemplary Electronic Devices

Figure 7:
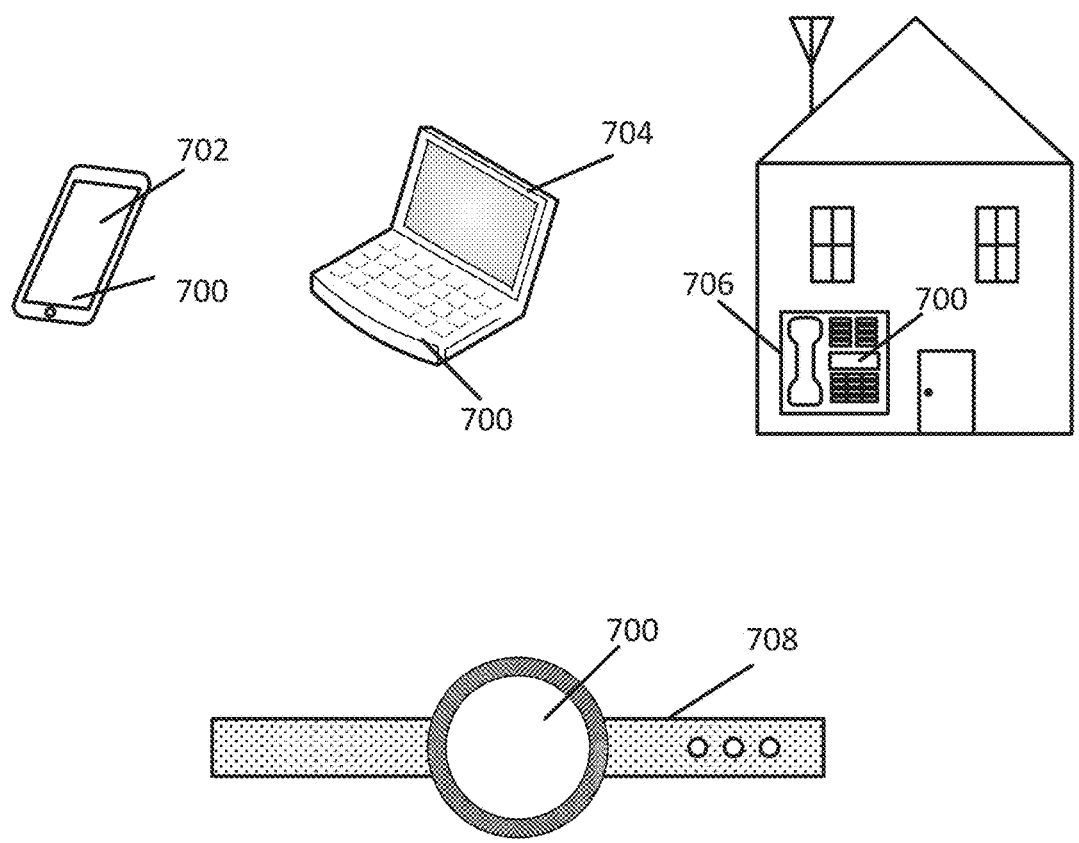
FIG. 7 illustrates various electronic devices that may include the various integrated devices, integrated device packages, semiconductor devices, dies, integrated circuits, and/or packages described herein.

FIG. 7 illustrates various electronic devices that may be integrated with any of the aforementioned package, integrated device, semiconductor device, integrated circuit, die, interposer, package or package-on-package (PoP). For example, a mobile phone device 702, a laptop computer device 704, a fixed location terminal device 706, a wearable device 708 may include an integrated device 700 as described herein. The integrated device 700 may be, for example, any of the integrated circuits, dies, integrated devices, integrated device packages, integrated circuit devices, device packages, integrated circuit (IC) packages, package-on-package devices described herein. The devices 702, 704, 706, 708 illustrated in FIG. 7 are merely exemplary. Other electronic devices may also feature the integrated device 700 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watch, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2, 3, 4A-4C, 5A-5C, 6, and/or 7 may be rearranged and/or combined into a single component, process, feature or function or embodied in several components, processes, or functions. Additional elements, components, processes, and/or functions may also be added without departing from the disclosure. It should also be noted that FIGS. 2, 3, 4A-4C, 5A-5C, 6, and/or 7 and its corresponding description in the present disclosure is not limited to dies and/or ICs. In some implementations, FIGS.

2, 3, 4A-4C, 5A-5C, 6, and/or 7 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A package comprising:
    a redistribution portion including:
        at least one dielectric layer; and
        at least one redistribution interconnect, wherein the at least one redistribution interconnect is configured to provide impedance matching between a first switch die and at least one first filter die from a plurality of first filter dies;
    a first portion coupled to the redistribution portion, the first portion including:
        the first switch die comprising a plurality of switch interconnects, wherein the first switch die is configured to operate as a switch; and
        a first encapsulation layer at least partially encapsulating the first switch die, wherein the first encapsulation layer touches the at least one dielectric layer of the redistribution portion; and
    a second portion coupled to the first portion, the second portion including:
        the plurality of first filter dies, each first filter die comprising a plurality of first filter interconnects, wherein each first filter die is configured to operate as a filter;
        a second encapsulation layer at least partially encapsulating the plurality of first filter dies; and
        a passivation layer coupled to the second encapsulation layer, the first encapsulation layer, and the first switch die, wherein the passivation layer is located between the first encapsulation layer and the second encapsulation layer.

2. The package of claim 1, wherein the first portion further comprises a second switch die positioned next to the first switch die, wherein the first encapsulation layer at least partially encapsulates the second switch die.

3. The package of claim 1, wherein the second portion further comprises a plurality of second filter dies positioned next to the plurality of first filter dies, wherein the second encapsulation layer at least partially encapsulates the plurality of second filter dies.

4. The package of claim 1, wherein two neighboring filter dies from the plurality of first filter dies have a spacing of about 100 microns ($\mu m$) or less.

5. The package of claim 1, wherein the second portion further comprises a through encapsulation interconnect that travels through the second portion, the through encapsulation interconnect is configured to provide an electrical path between the plurality of first filter dies and the redistribution portion.

6. The package of claim 5, wherein the plurality of first filter dies and the first switch die are electrically coupled to each other through at least one electrical path that includes the plurality of first switch interconnects, the redistribution portion, the through encapsulation interconnect and the plurality of first filter interconnects.

7. The package of claim 1, wherein the first switch die is located between the redistribution portion and the plurality of first filter dies.

8. The package of claim 1, wherein the package is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

9. An apparatus comprising:
    a redistribution portion including:
        at least one dielectric layer; and
        at least one redistribution interconnect, wherein the at least one redistribution interconnect is configured to provide impedance matching between a first switching means and at least one first filtering means from a plurality of first filtering means;
    a first portion coupled to the redistribution portion, the first portion including:
        the first switching means comprising a plurality of switch interconnects, wherein the first switching means is configured to operate as a switch; and
        a first encapsulation layer at least partially encapsulating the first switching means, wherein the first encapsulation layer touches the at least one dielectric layer of the redistribution portion; and
    a second portion coupled to the first portion, the second portion including:
        the plurality of first filtering means, each first filtering means comprising a plurality of filter interconnects, wherein each first filtering means is configured to operate as a filter;
        a second encapsulation layer at least partially encapsulating the plurality of first filtering means; and
        a passivation layer coupled to the second encapsulation layer, the first encapsulation layer, and the first switching means, wherein the passivation layer is located between the first encapsulation layer and the second encapsulation layer.

10. The apparatus of claim 9, wherein the first portion further comprises a second switching means positioned next to the first switching means, the second switching means configured to operate as a switch, wherein the first encapsulation layer at least partially encapsulates the second switching means.

11. The apparatus of claim 9, wherein the second portion further comprises a plurality of second filtering means positioned next to the plurality of first filtering means, each second filtering means configured to operate as a filter, wherein the second encapsulation layer at least partially encapsulates the plurality of second filtering means.

12. The apparatus of claim 9, wherein two neighboring filtering means from the plurality of first filtering means have a spacing of about 100 microns (μm) or less.

13. The apparatus of claim 9, wherein the second portion further comprises a through encapsulation interconnect that travels through the second portion, the through encapsulation interconnect configured to provide an electrical path between the plurality of first filtering means and the redistribution portion.

14. The apparatus of claim 9, wherein the apparatus is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

15. A method for fabricating a package, comprising:
  forming a second portion that includes:
    providing a plurality of first filter dies, each first filter die including a plurality of filter interconnects, wherein each filter die is configured to operate as a filter;
    forming a second encapsulation layer that at least partially encapsulates the plurality of first filter, and
    forming a passivation layer over the second encapsulation layer;
  forming a first portion over the second portion, wherein forming the first portion includes:
    providing a first switch die over the passivation layer, the first switch including a plurality of switch interconnects, wherein the first switch is configured to operate as a switch; and
    forming a first encapsulation layer that at least partially encapsulates the first switch die; and
  forming a redistribution portion over the first portion, wherein forming the redistribution portion includes:
    forming at least one dielectric layer over the first encapsulation layer; and
    forming at least one redistribution interconnect, wherein the at least one redistribution interconnect is configured to provide impedance matching between the first switch die and at least one first filter die from the plurality of first filter dies.

16. The method of claim 15, wherein the forming first portion further comprises providing a second switch die next to the first switch die, wherein the first encapsulation layer at least partially encapsulates the second switch die.

17. The method of claim 15, wherein forming the second portion further comprises providing a plurality of second filter dies next to the plurality of first filter dies, wherein the second encapsulation layer at least partially encapsulates the plurality of second filter dies.

18. The method of claim 15, wherein forming the second portion further comprises a providing a through encapsulation interconnect that travels through the second portion, the through encapsulation interconnect configured to provide an electrical path between the plurality of first filter dies and the redistribution portion.

19. The package of claim 1, further comprising:
  an adhesive layer located over the second encapsulation layer and the plurality of first filter dies; and
  a plurality of interconnects located in the passivation layer, wherein the plurality of interconnects is located between the plurality of first filter dies and the first switch die.

20. The package of claim 19,
  wherein the adhesive layer and the second portion form a back side of the package, and
  the redistribution portion forms a front side of the package.

* * * * *